United States Patent [19]

Keller et al.

[11] Patent Number: 4,476,151
[45] Date of Patent: Oct. 9, 1984

[54] METHOD AND DEVICE FOR ATTACHING DISC-OR PLATE-SHAPED TARGET BODIES TO COOLING PLATES FOR SPUTTERING SYSTEMS

[75] Inventors: Hartmut Keller, Pöcking; Aroon S. Roy, Petershausen, both of Fed. Rep. of Germany

[73] Assignee: Siemens Aktiengesellschaft, Berlin and Munich, Fed. Rep. of Germany

[21] Appl. No.: 526,120

[22] Filed: Aug. 24, 1983

[30] Foreign Application Priority Data

Sep. 7, 1982 [DE] Fed. Rep. of Germany ....... 3233215

[51] Int. Cl.³ .......................... B23K 31/02; B05D 1/00
[52] U.S. Cl. .................................... 427/34; 427/374.6; 427/376.8; 228/221; 228/231; 164/61
[58] Field of Search .................... 427/374.6, 376.8, 34; 228/221, 227, 231; 164/61

[56] References Cited

U.S. PATENT DOCUMENTS 2,092,557 9/1937 Quamstrom ...................... 427/374.6
4,341,816 7/1982 Lauterbach et al. ................. 427/34

Primary Examiner—John E. Kittle
Assistant Examiner—James J. Seidleck
Attorney, Agent, or Firm—Hill, Van Santen, Steadman & Simpson

[57] ABSTRACT

A target body composed of a select target material is attached to a cooling plate for sputtering systems in such a manner that substantially no bubbles, pores or oxide layers are present in the ultimate solder joint between the surfaces joined together. A pre-soldered target body and a corresponding presoldered cooling plate are exposed, in a vacuum, to a temperature above the melting point of the solder utilized so that degasification of the liquified solder occurs and any oxide layers present are decomposed and purged from the solder. Upon cooling in vacuum, the solder resolidifies and excludes any air bubbles, pores or oxide layers. A frame body with a two-step recess, with a lower recess or opening snugly fitting about a cooling plate and an upper opening freely fitting about the solder joint can be used to practice this technique. A subsequent reflow soldering can likewise occur in vacuum at a temperature above the melting point of the solder utilized.

2 Claims, 4 Drawing Figures

METHOD AND DEVICE FOR ATTACHING DISC- OR PLATE-SHAPED TARGET BODIES TO COOLING PLATES FOR SPUTTERING SYSTEMS

BACKGROUND OF THE INVENTION

1. Field of the Invention

The invention relates to sputtering systems and somewhat more particularly to a method and device for attaching target bodies onto cooling plates for sputtering systems.

2. Prior Art

German Published Application No. 29 33 835, generally equivalent to U.S. Pat. No. 4,341,816, both of which are assigned to the instant assignee, describes and claims a method for attaching target bodies composed of select target material onto cooling plates for sputtering systems wherein an adhesive material compatible with the target material, for example composed of Ni; Ni/Cr mixtures, 80/20 Ni/Al mixtures; Ni/Al/Mo mixtures; Al/bronze mixtures; Mo; W; Al-Si mixtures; Zn; Cu; Cu/glass mixtures; etc. is applied, preferably via plasma spraying, onto a surface of a target body and subsequently, a relatively thick solderable layer, for example composed of Cu; Cu/glass mixture; silver, etc. is coated, preferably via plasma spraying, onto the adhesive layer. The so-coated surface of the target body and a corresponding surface of a cooling plate are then joined or attached to one another by a soft solder layer.

In this manner, practically all standard target materials, such as non-solderable metallic, glass, ceramic, oxide, silicon or graphite target materials as well as directly solderable target materials can be attached to cooling plates with good adhesion and good thermal contact between a select target body and a cooling plate. However, it has been noted that the attachment joint or connection produced in this manner is not absolutely free of bubbles and pores. Further, in many instances, oxide layers existing on the pre-soldered surfaces of a target body and cooling plate can cause voids or the like in the cross-section of the connecting solder joint.

SUMMARY OF THE INVENTION

The invention provides an improved method and device for attaching a select target body onto a cooling plate for sputtering systems whereby the connecting joint is substantially free of bubbles and pores. Further, by practicing the principles of the invention, any existing oxide layers on the pre-soldered surfaces are reliably eliminated.

In accordance with the principles of the invention, pre-soldered target bodies, which can be in the form of discs or plates, and associated pre-soldered cooling plates are exposed in a vacuum to a temperature above the melting point of the solder utilized for pre-soldering so that the resultant liquified solder is degasified and any oxide layers that may be present are decomposed and eliminated. Thereafter, the components are maintained in associated position under vacuum while the temperature is reduced below the melting point of the solder so that the solder re-solidifies and attaches or joins the associates surfaces of the target body and cooling plate to one another without air bubbles, pores or oxide layers being present in the joint area.

A subsequent reflow soldering can likewise occur in vacuum at a temperature above the melting point of the solder utilized for reflow soldering.

In this manner, bubbles, pores or oxide layers are reliably purged from the cross-section of a solder joint between a target body and a cooling plate.

The improved inventive method can be particularly advantageously practiced with the use of a novel frame body which is, during operation, positioned around an assembled pre-soldered target body and pre-soldered cooling plate. The frame body has a stepped recess for receiving the target body-cooling plate assembly and includes a fluid-receiving gap at least around the periphery of the soldered joint area. During operation, the cross-section of the joint can be completely filled with liquified solder and any bubbles, pores or oxide layers are purged from the liquified solder through the fluid-receiving gap.

DESCRIPTION OF PREFERRED EMBODIMENTS

Figure 1:
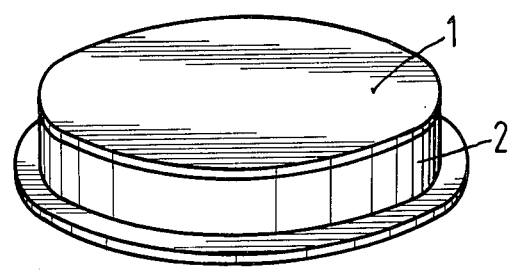
FIG. 1 is a somewhat elevated plan view of a disc-shaped target body attached to a cooling plate in accordance with the principles of the invention.

FIG. 1 illustrates a target disc 1 formed of any desired target material attached to a circular or cylindrical cooling plate 2 by a solder joint (not shown).

Figure 2:
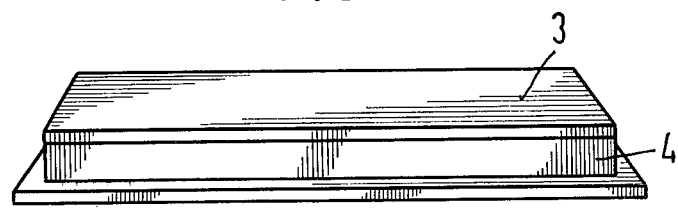
FIG. 2 is a somewhat similar elevated plan view of a rectangular plate-shaped target body attached to a cooling plate in accordance with the principles of the invention.

FIG. 2 illustrates a rectangular target plate 3 formed of any desired target material attached to a corresponding rectangular cooling plate 4 by a solder joint (not shown).

The fabrication of the target structure illustrated in FIGS. 1 and 2 proceeds in such a manner that an adhesive layer is applied to a surface of a target body (disc 1 or plate 3) to be joined to a corresponding surface of a cooling plate (cylindrical plate 2 or rectangular plate 4). The adhesive material for this adhesive layer is selected so as to be compatible with the target material forming the target body. Preferably, the adhesive layer is applied via plasma spraying.

A solderable cover layer (not shown) is subsequently applied onto the foregoing adhesive layer in order to make the target body solderable. Preferably, this solderable cover layer is also applied via plasm spraying. It has been particularly advantageous to utilize copper, copper-glass or silver to form the relatively thick (approximately 30 through 100 $\mu$m) solderable cover layer.

After application of the adhesive layer and the solderable cover layer, the so-coated target body as well as an associated cooling plate are pre-soldered with a suitable soft solder fluxing agent.

In order to degasify the solder joint and decompose any oxide layers which may be present, an assembly of a pre-soldered target body (disc 1 or plate 3) and associate cooling plate (circular body 2 or rectangular body 4) are positioned in a vacuum chamber and exposed to a temperature above the melting point of the solder utilized for pre-soldering. In this manner, the solder is liquified and any air bubbles, pores or oxide layers escape therefrom so that upon cooling, the resultant solder joint is free of bubbles, pores or oxide layers. A subsequent reflow soldering occurs in a similar manner, in vacuum at a temperature above the melting point of the solder utilized for reflow soldering.

Figure 3:
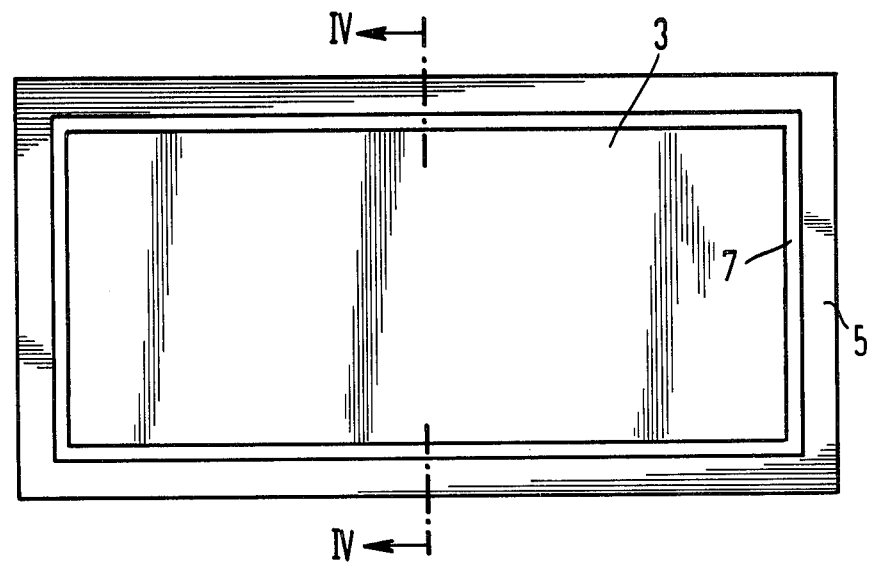
FIG. 3 is a top plan taken of the assembly shown in FIG. 2, with an associated frame body.
Figure 4:
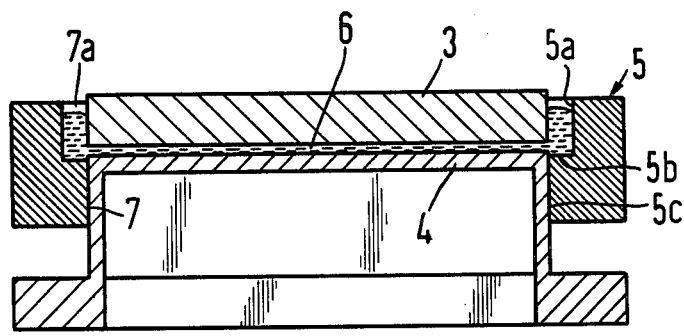
FIG. 4 is an elevated cross-sectional view, taken substantially along line IV—IV of FIG. 3 illustrating the frame body associated with an assembled target and cooling plate.

Referring now to FIGS. 3 and 4 wherein the foregoing is explained in somewhat more greater detail.

For example, before a reflow soldering step, a frame body 5, which is molten solder-impermeable, is positioned around, for example, a rectangular cooling plate 4, as shown in FIG. 2. The frame body is provided with a central recess 7 adapted to receive an assembled target body 3 and cooling plate 4. The recess 7 has, as shown, two spaced-apart inner side walls 5a and 5c joined to one another by a shoulder wall 5b. The upper inner side wall 5a defines a first opening of a size adapted to freely receive at least the solder joint area 6 between the assembled target body 3 and cooling plate 4 so that a fluid-receiving gap 7a is defined between the outer edges of the solder joint and an inner surface of the first opening, substantially as shown. The lower inner side wall 5c defines a second opening of a size adapted to snuggly mate in a molten solder-impermeable manner with outer peripheral side surfaces of the cooling plate 4.

Thus, the frame body 5 is placed around a cooling plate so that the first opening surrounds the solder gap or joint area 6 between the cooling plate 4 and the target plate 3 put in place thereon so that a trough-like groove is formed between the assembled members and which is unimpeded for any purged gas or the like which may travel from the solder joint or gap area 6 away from the assembled components. In preferred embodiments, the shoulder wall 5b, forming a floor for the first opening when in assembly or operational position, is preferably located slightly below the upper surface of the cooling disc 4 or just below the lower surface of the solder joint area 6.

The resulting assembly of parts combined in the above manner are now attached to one another in a vacuum by a reflow soldering. During the soldering operation, at which time the assembly is exposed to a temperature above the melting point of the solder utilized, any excess solder flows out of gap area 6, along with any entrapped air bubbles, pores or oxide layers, and such excess liquified solder, along with any entrapped air bubbles, etc., rises up into the fluid-receiving gap 7a. The air bubbles and the like are purged from the liquified solder by the vacuum. After purging, the vacuum is maintained about the assembled parts while the temperature is reduced below the melting point of the solder so that the solder solidifies between the surfaces being attached to one another. In this manner, the entire solder joint or gap remains covered with solder preventing any air or the like from becoming entrapped therein.

Refering again to FIGS. 2, 3 and 4 one detailed exemplary embodiment is explained. In this embodiment the target body 3 has the form of a rectangular plate having a length of 380 mm, a breadth of 123 mm and a thickness of 10 mm. One surface of this rectangular target body 3 is coated with an adhesive layer composed of a 95/5 Ni/Al mixture and having a thickness of about 40 $\mu$m via plasma spraying. Thereafter, also by means of plasma spraying, a solderable cover layer composed of Cu is applied over the adhesive layer with a thickness of about 150 $\mu$m. After application of the adhesive layer and the solderable cover layer the target body 3 as well as the associated cooling plate 4 are pre-soldered with the use of suitable soft solder fluxing agents. The respective solder layers composed of a 63/37 Sn/Pb solder have both a thickness of about 500 $\mu$m. The rectangular cooling plate 4 composed of Cu has a length of 380 mm, a breadth of 123 mm and an overall thickness including the lower flange area of 32 mm.

After pre-soldering of the target body 3 and the cooling plate 4 the molten solder impermeable frame body 5 is positioned on the cooling plate 4. In order to allow the mounting of the frame body 5 on the cooling plate 4 and the removal therefrom the frame body 5 is divided in a circumferential direction into four parts, which are first positioned around the cooling plate 4 and then connected by suitable spanning means like screws. These spanning means and the division of the frame body 5 are not shown in FIGS. 3 and 4.

After the mounting of the frame body 5 the target body 3 is positioned on the cooling plate 4 and the assembled components are exposed in a vacuum to a temperature above the melting point of the solder utilized for pre-soldering. The excess liquified solder then rises up into the fluid receiving gap 7a defined by the frame body 5. To center the target body 3 on the liquified solder layer the frame body 3 possesses six centering arms which are adjustable in all directions and which extend to the periphery of the target body 3. These centering arms are not shown in FIGS. 3 and 4.

Due to the capillary forces in the gap area 6 the remaining amount of solder ensures a tight solder connection of target body 3 and cooling plate 4. After resolidification the resulting solder layer in the gap area 6 has a thickness in the range of about 50 to 300 $\mu$m, according to the density of the target material. After the removal of the frame body 5 the re-solidified excess solder is removed mechanically.

Thus, by following the principles of the invention, one can reliably and economically guarantee that an entire solder joint is filled with a select solder material. Soldering in a vacuum produces a solder connection or joint which exhibits a high degree of freedom from bubbles, pores and oxide layers, while providing optimum thermal conductivity between the surfaces so-joined.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A device for attaching a target body composed of a select target material onto a cooling plate for sputtering systems through a solder joint between facing surfaces of said body and plate so that substantially no air bubbles, pores or oxide layers exist in the solder joint or on said facing surfaces, comprising:

a molten solder-impermeable frame body having an outer and an inner vertical surface defining a central recess adapted to receive an assembled target body and cooling plate;

said central recess having two spaced-apart inner side walls joined to one another by a shoulder wall;

an upper inner side wall of said recess defining a first opening of a size adapted to freely receive at least the solder joint area between an assembled target body and cooling plate so that a fluid-receiving gap is defined between outer edges of the solder joint and an inner peripheral surface of said first opening;

a lower inner side wall of said recess defining a second opening of a size adapted to snuggly mate in a molten solder-impermeable manner with outer peripheral side surfaces of said cooling plate;

whereby when said frame body is operationally positioned on an assembled target body and cooling plate with the solder joint therebetween and the resulting assembly is exposed in vacuum to a temperature above the melting point of the solder defining the solder joint, any air bubbles, pores or oxide layers present in the solder or on facing surfaces of the body and plate are removed from the liquified gas and escape through the fluid-receiving gap.

2. A device as defined in claim 1, wherein said shoulder wall joining the upper and lower side walls of the central recess is located, when the frame body is operationally positioned on the assembled target body and cooling plate with the solder joint therebetween, below the lower surface of said solder joint.

* * * * *